(12) United States Patent
Douglas

(10) Patent No.: US 7,610,023 B2
(45) Date of Patent: Oct. 27, 2009

(54) VOLTAGE CONTROLLED OSCILLATOR BAND SWITCHING SYSTEM

(75) Inventor: Dale Scott Douglas, Jersey City, NJ (US)

(73) Assignee: Pine Valley Investments, Inc., Las Vegas, NV (US)

( * ) Notice: Subject to any disclaimer, the term of this patent is extended or adjusted under 35 U.S.C. 154(b) by 908 days.

(21) Appl. No.: 11/187,150

(22) Filed: Jul. 22, 2005

(65) Prior Publication Data

US 2007/0021072 A1 Jan. 25, 2007

(51) Int. Cl.
*H04B 1/40* (2006.01)
*H04B 1/18* (2006.01)
*H04B 1/06* (2006.01)

(52) U.S. Cl. .................. 455/87; 455/264; 455/188.1

(58) Field of Classification Search .............. 455/87, 455/168.1, 176.1, 113, 177.1, 180.1, 188.1, 455/180.3, 260, 264, 85, 86
See application file for complete search history.

(56) References Cited

U.S. PATENT DOCUMENTS

| | | | |
|---|---|---|---|
| 5,952,895 A | 9/1999 | McCune, Jr. et al. | 332/128 |
| 6,094,101 A | 7/2000 | Sander et al. | 331/17 |
| 6,140,882 A | 10/2000 | Sander | 331/25 |
| 6,255,912 B1 | 7/2001 | Laub et al. | 331/25 |
| 2003/0031267 A1 | 2/2003 | Hietala | 375/295 |

*Primary Examiner*—Eugene Yun
(74) *Attorney, Agent, or Firm*—Allen, Dyer, Doppelt, Milbrath & Gilchrist, P.A.

(57) ABSTRACT

An apparatus, method, and system for voltage controlled oscillator band switching are described. A band switching apparatus may include a reference generation and comparison module, a clock pulse generation module, and a counter and gating module. The reference generation and comparison module may generate a positive signal based on a comparison of a loop filter voltage associated with a voltage controlled oscillator to a maximum tuning voltage and a minimum tuning voltage. The clock pulse generation module may generate a clock pulse in response to the positive signal. The counter and gating module may disable band switching of the voltage controlled oscillator when a lock condition is detected and the loop filter voltage is between the maximum tuning voltage and the minimum tuning voltage. Other embodiments are described and claimed.

25 Claims, 6 Drawing Sheets

600

```
┌─────────────────────────────────────────────┐
│ ESTABLISH HI SWITCHING POINT AND LO SWITCHING POINT │
│                    602                      │
└─────────────────────────────────────────────┘
                      │
┌─────────────────────────────────────────────┐
│  COMPARE LOOP FILTER VOLTAGE TO HI SWITCHING POINT │
│           AND LO SWITCHING POINT            │
│                    604                      │
└─────────────────────────────────────────────┘
                      │
┌─────────────────────────────────────────────┐
│   GENERATE POSITIVE SIGNAL (UP=TRUE, DOWN=TRUE) │
│             BASED ON COMPARISON             │
│                    606                      │
└─────────────────────────────────────────────┘
                      │
┌─────────────────────────────────────────────┐
│             GENERATE CLOCK PULSE            │
│          IN RESPONSE TO POSITIVE SIGNAL     │
│                    608                      │
└─────────────────────────────────────────────┘
                      │
              ◇ DETECT LOCK CONDITION ◇
                       610
                   Y  /     \  N
                     /       \
┌─────────────────────────────────────────────┐
│   INCREMENT COUNTER BASED ON CLOCK PULSE    │
│           TO DRIVE VCO BAND SWITCHING       │
│                    612                      │
└─────────────────────────────────────────────┘
                      │
┌─────────────────────────────────────────────┐
│ DISABLE BAND SWITCHING WHEN LOOP FILTER VOLTAGE IS │
│  BETWEEN HI SWITCHING POINT AND LO SWITCHING POINT │
│                    614                      │
└─────────────────────────────────────────────┘
```

FIG. 6

VOLTAGE CONTROLLED OSCILLATOR BAND SWITCHING SYSTEM

BACKGROUND

A voltage controlled oscillator (VCO) may be implemented within a wireless communications system such as a radio frequency (RF) system, a cellular communications system, a personal communications system (PCS), and a wireless network. For example, a VCO may form part of the circuitry of a wireless device. To achieve wider tuning range or better noise performance, a VCO may provide multiple tuning bands. Accordingly, there may be a need for improved systems and techniques for switching among VCO tuning bands.

SUMMARY

One exemplary embodiment includes a band switching apparatus comprising a reference generation and comparison module to generate a positive signal based on a comparison of a loop filter voltage associated with a voltage controlled oscillator to a maximum tuning voltage and a minimum tuning voltage. The apparatus may include a clock pulse generation module to generate a clock pulse in response to the positive signal. The apparatus may include a counter and gating module to disable band switching of the voltage controlled oscillator when a lock condition is detected and the loop filter voltage comprises a voltage between the maximum tuning voltage and the minimum tuning voltage. Other embodiments are described and claimed.

BRIEF DESCRIPTION OF THE DRAWINGS

FIG. 6 illustrates a logic flow for performing band switching in accordance with one embodiment.

DETAILED DESCRIPTION

Figure 1:
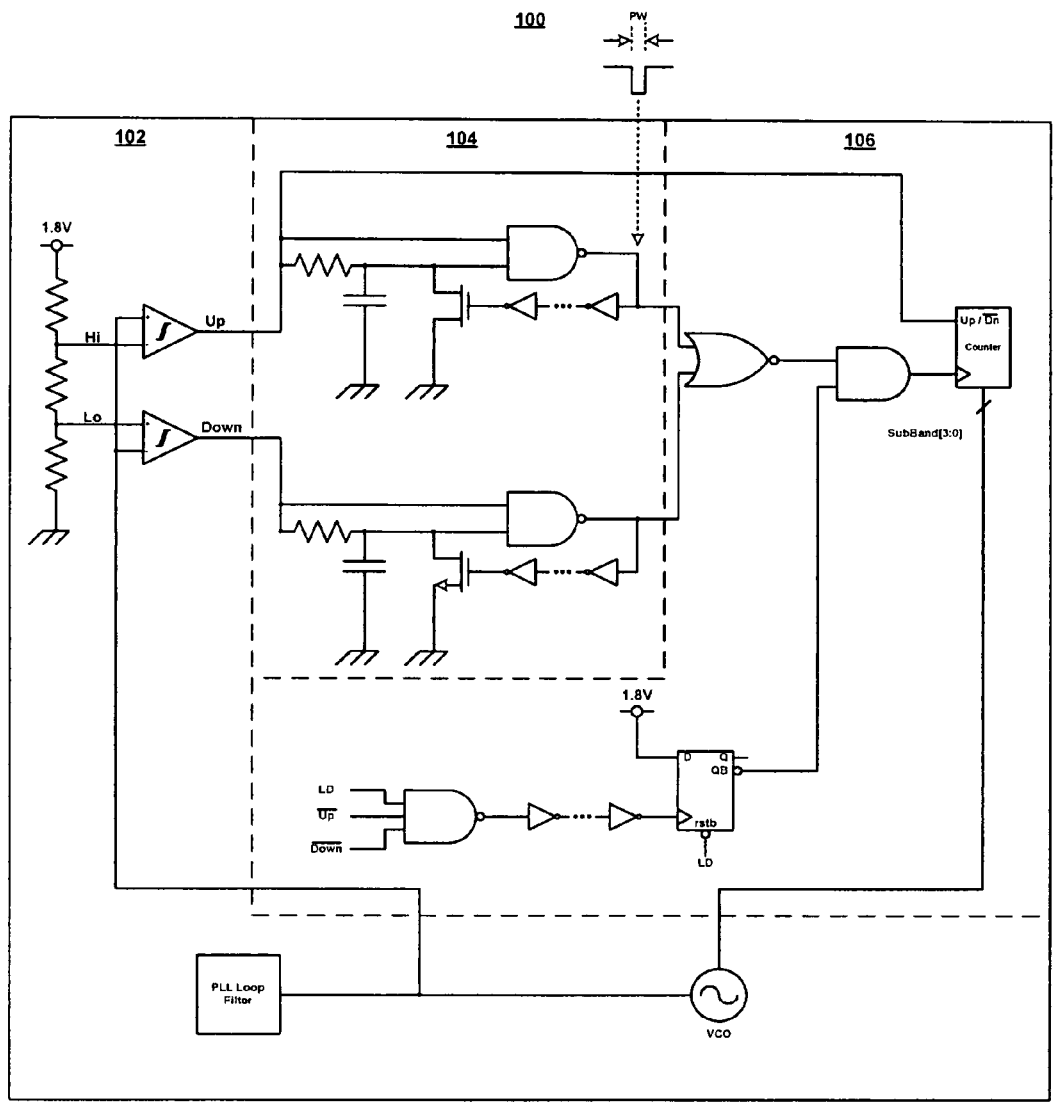
FIG. 1 illustrates a block diagram of a band switching system in accordance with one embodiment.

FIG. 1 illustrates a block diagram of a band switching system 100 in accordance with one embodiment. In various embodiments, the band switching system 100 may comprise various physical or logical entities for communicating information and may be implemented as hardware, software, or any combination thereof, as desired for a given set of design parameters or performance constraints.

In various embodiments, the band switching system 100 may comprise, or be implemented as, a computer system, a computer sub-system, a computer, an appliance, a workstation, a terminal, a server, a personal computer (PC), a laptop, an ultra-laptop, a handheld computer, a personal digital assistant (PDA), a set top box (STB), a telephone, a mobile telephone, a cellular telephone, a handset, a wireless access point, a base station, a radio network controller (RNC), a mobile subscriber center (MSC), a microprocessor, an integrated circuit (IC), a programmable logic device (PLD), a processor such as general purpose processor, a digital signal processor (DSP) and/or a network processor, an interface, an input/output (I/O) device (e.g., keyboard, mouse, display, printer), a router, a hub, a gateway, a bridge, a switch, a circuit, a logic gate, a register, a semiconductor device, a chip, a transistor, or any other device, machine, tool, equipment, component, or combination thereof.

In various embodiments, for example, the band switching system 100 may comprise, or be implemented as, software, a software module, an application, a program, a subroutine, an instruction set, computing code, words, values, symbols or combination thereof according to a predefined computer language. Examples of a computer language may include C, C++, Java, BASIC, Perl, Matlab, Pascal, Visual BASIC, assembly language, machine code, and so forth.

In various implementations, the band switching system 100 may comprise, or be implemented as an IC such as a power management integrated circuit (PMIC) for example. The IC may comprise, for example, RF circuitry, logic, and memory. The RF circuitry may comprise, for example, RF transmitter and receiver portions, each comprising a collection of discrete components. Logic may comprise, for example, a processor, controller, state machine, programmable logic array, and the like, and may operate under the control of program instructions. Memory may comprise, for example, program memory, data memory or any combination thereof. Memory also may comprise, for example, read-only memory (ROM), random-access memory (RAM), static RAM (SRAM) dynamic RAM (DRAM), Double-Data-Rate DRAM (DDRAM), synchronous DRAM (SDRAM), programmable ROM (PROM), erasable programmable ROM (EPROM), electrically erasable programmable ROM (EEPROM), flash memory, or any other type of media suitable for storing information.

In various embodiments, the band switching system 100 may comprise multiple modules connected by one or more communications media. Communications media generally may comprise any medium capable of carrying information signals. For example, communications media may comprise wired communications media, wireless communications media, or a combination of both, as desired for a given implementation. Examples of wired communications media may include a wire, cable, printed circuit board (PCB), backplane, semiconductor material, twisted-pair wire, co-axial cable, fiber optics, and so forth. An example of a wireless communications media may include portions of a wireless spectrum, such as the radio-frequency (RF) spectrum.

The modules may comprise, or be implemented as, one or more systems, sub-systems, devices, components, circuits, logic, programs, or any combination thereof, as desired for a given set of design or performance constraints. For example, the modules may comprise electronic elements fabricated on a substrate. In various implementations, the electronic elements may be fabricated using silicon-based IC processes such as complementary metal oxide semiconductor (CMOS), bipolar, and bipolar CMOS (BiCMOS) processes, for example.

The band switching system 100 may comprise a reference generation and comparison module 102. In various embodiments, the reference generation and comparison module 102 may be arranged to provide a first reference voltage and a second reference voltage. The first reference voltage may establish a maximum acceptable tuning voltage (Hi), and the second reference voltage may establish a minimum acceptable tuning voltage (Lo). In various implementations, the reference generation and comparison module 102 may generate a positive signal (e.g., Up=true, Down=true) based on a comparison of a loop filter voltage to the Hi switching point and the Lo switching point. For example, a positive signal (UP=true) may be generated in the event that the loop filter voltage is instantaneously greater than the Hi switching point. A positive signal (Down=true) may be generated in the event that the loop filter voltage is instantaneously less than the Lo switching point. The loop filter voltage may be provided by a phase-locked loop (PLL) filter based on an output voltage waveform of a VCO, for example.

The band switching system 100 may comprise a clock pulse generation module 104. In various embodiments, the clock pulse generation module 104 may be arranged to generate a clock pulse in response to a positive signal (e.g., Up=true, Down=true) provided by the reference generation and comparison module 102. In various implementations, the clock pulse may comprise a first time constant to provide a delay before action occurs. The first time constant may be associated with a low pass filter (LPF) and provide a setup time proportional to the LPF time constant, for example. The first time constant may be arranged to delay a band switching decision to avoid glitching or undershoot/overshoot, which could trigger a band switch. The first time constant also may be arranged to compensate for the momentary delay of a loop voltage at a reference voltage after changing bands.

In various implementations, the clock pulse may comprise a second time constant equal to a delay through a chain of inverters. The second time constant may provide a hold time for a pulse equal to the inverter chain delay, for example. In various embodiments, the clock pulse generation module 104 may generate a pulse having a pulse width (PW) proportional to the number of inverters (e.g., n=5) in the inverter chain. The delay provided by the inverter chain may be determined by the minimum clock pulse width of a counter, for example.

The band switching system 100 may comprise a counter and gating module 106. In various embodiments, the counter and gating module 106 may be arranged to detect a lock condition. In various implementations, the counter and gating module 106 may increment a counter based on the clock pulse to drive VCO band switching when a lock condition is not detected. The counter and gating module 106 may disable band switching when a lock condition is detected and the loop filter voltage is between the Hi switching point and the Lo switching point. The counter and gating module 106 also may disable band switching when a lock condition is detected and the loop filter voltage previously was between the Hi switching point and the Lo switching point. For example, band switching may be disabled if the loop filter voltage momentarily goes above the Hi switching point or below the Lo switching point. Once disabled, band switching may remain disabled until the lock condition is not longer detected.

Figure 2:
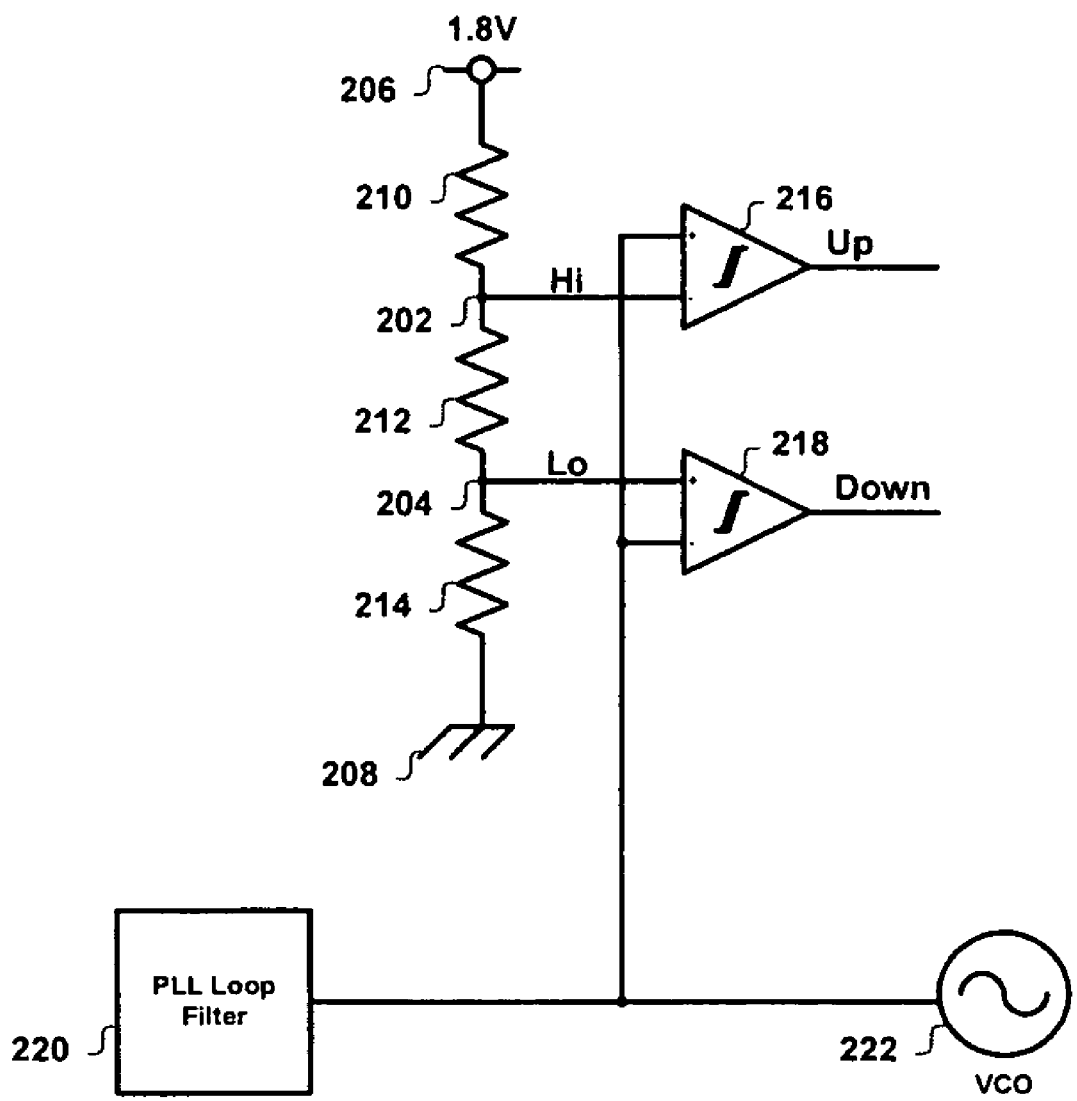
FIG. 2 illustrates a block diagram of a reference generation and comparison module in accordance with one embodiment.

FIG. 2 illustrates a block diagram of a reference generation and comparison module 200 in accordance with one embodiment. In various embodiments, the reference generation and comparison module 200 may comprise, or be implemented as, the reference generation and comparison module 102 of band switching system 100. The embodiments are not limited in this context.

The reference generation and comparison module 200 may comprise a first node 202 to provide a first reference voltage, and a second node 204 to provide a second reference voltage. In various embodiments, the first reference voltage may establish a Hi switching point associated with a maximum acceptable tuning voltage, and the second reference voltage may establish Lo switching point associated with a minimum acceptable tuning voltage. The first reference voltage and the second reference voltage may be derived from a positive supply voltage Vdd 206 (e.g., 1.8V CMOS) to ground 208 through a first resistor 210, a second resistor 212, and a third resistor 214.

In various embodiments, the Hi switching point may be provided at the positive input of a first comparator 216, and the Lo switching point may be provided at the positive input of a second comparator 218. The negative input of the first comparator 216 and the negative input of the second comparator may be connected to a PLL filter 220 and a VCO 222.

The reference generation and comparison module 200 may comprise a PLL filter 220. In various embodiments, the PLL filter 220 may be arranged to provide a loop filter voltage based on the output voltage waveform of the VCO 222. The PLL filter 220 may comprise, for example, a phase detector and a charge pump that produces pulses of current integrated by a loop filter to output a voltage related to frequency. In various implementations, the PLL filter 220 may be arranged to compare the edges of a reference clock signal (e.g., square wave) and the output voltage waveform of the VCO 222. In the event that the edges are not aligned, the frequency is not locked, and a logical Exclusive-OR (XOR) of the two pulses provides an indication of the phase error. For example, the XOR of the two signals may provide a narrowing pulse whose integrated DC value is proportional to the phase error.

In various implementations, the PLL filter 220 may integrate (filter) the current pulses produced by the charge pump; which is in turn controlled by a phase-frequency detector (PFD) that calculates the phase error between the two signals. The pulses may be filtered to a DC level by the PLL filter 220, and the output frequency of the VCO 22 may be proportional to this voltage and the band select word.

In various embodiments, the VCO 222 may comprise an oscillator circuit such as a CMOS VCO, for example. The VCO 222 may provide multiple bands such as 2" tuning bands (e.g., sub-bands) with n-bits of control, for example. In various implementations, the VCO 222 may provide individual tuning bands selectable by a VCO band select word. In one embodiment, for example, the VCO band select word (Sub-Band) may comprise a 4 bit word (e.g., 1111 highest frequency).

In various implementations, the PLL filter 220 may output a loop filter voltage to the first comparator 216 and the second comparator 218. The first comparator 216 may be arranged to generate a positive signal (UP=true) in the event that the loop filter voltage is instantaneously greater than the Hi switching point. The second comparator 218 may be arranged to generate a positive signal (Down=true) in the event that the loop filter voltage is instantaneously less than the Lo switching point. In one embodiment, positive logic notation for true=Vdd.

In various implementations, the values for the Hi and Lo switching points may be chosen to have appropriate values over process and temperature. In one embodiment, the Hi switching point may comprise a voltage of about 350 mV below Vdd 206, and the Lo switching point may comprise a voltage of about above 350 mV above ground 208. The Hi and Lo switching points also may be chosen such that individual tuning bands of the VCO 222 have some overlap. For example, the values of the Hi and Lo switching points may be chosen so that if the desired tuning frequency is slightly too high to be reached within the constraints of Lo and Hi on one band, the desired tuning frequency is not too low to be reached within the constraints of Hi and Lo on the next band.

In various implementations, the reference voltage at the first node 202 and the reference voltage at the second node 204 are derived from Vdd 206. As a result, the Hi switching point and Lo switching point may be scaled with Vdd 206.

With respect to establishing the Hi switching point, scaling may be advantageous because the charge pump driving the PLL filter 220 may have a linear range of operation. As a result, the maximum of the linear range of the charge pump may scale with Vdd 206. In one embodiment, the Hi switching point may vary the same percentage that Vdd 206 varies (e.g., 1:1). In some cases, it may be desirable to maintain a relatively fixed Lo switching point. As such, scaling may not be as advantageous with respect to the Lo switching point. In various embodiments, the voltage division makes the Lo switching point less sensitive to changes than the Hi switching point.

In various embodiments, the Lo switching point and the Hi switching point may have good relative matching (e.g., 1% to 2%). The offset voltages of the comparators may be a diminishingly small error term.

Figure 3:
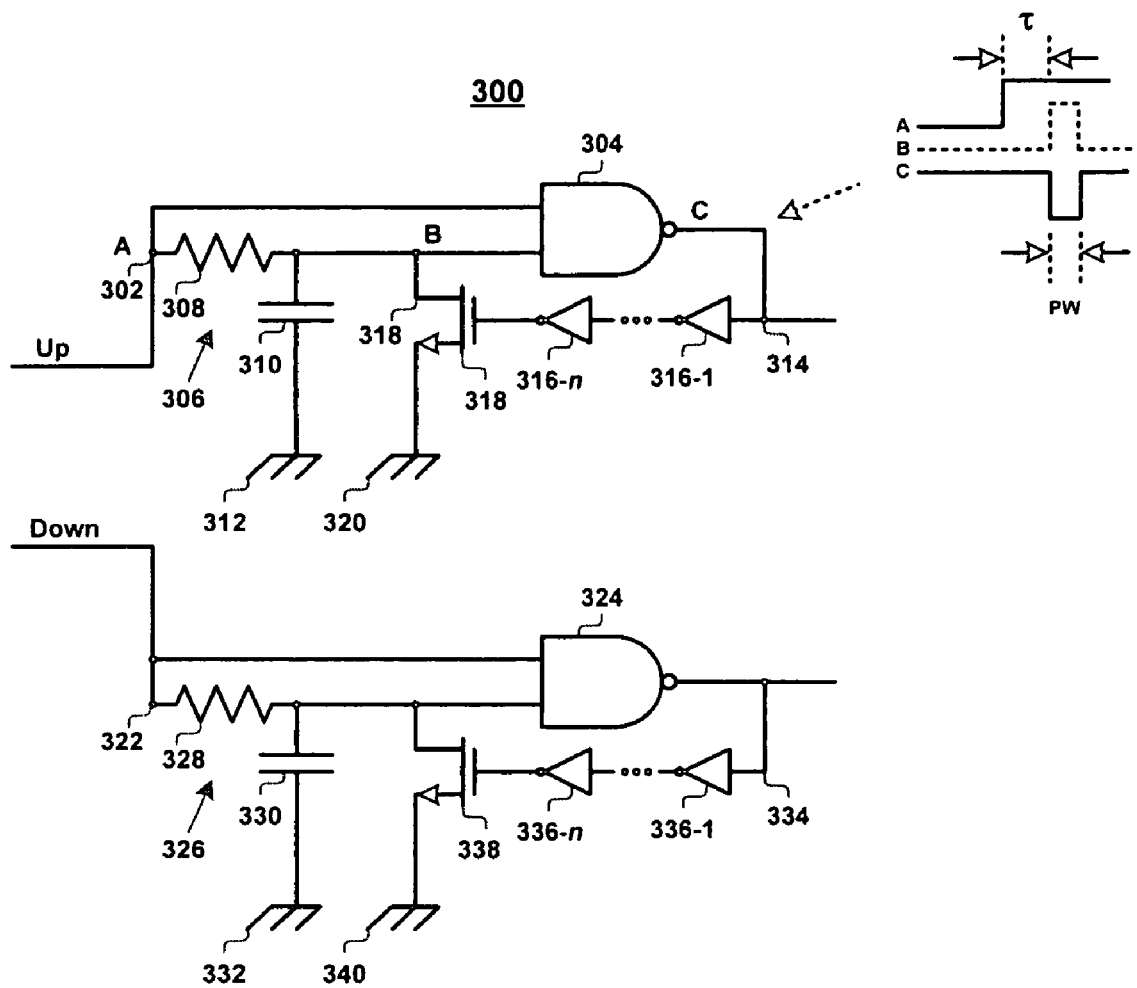
FIG. 3 illustrates a block diagram of a clock pulse generator module in accordance with one embodiment.

FIG. 3 illustrates a block diagram of a clock pulse generator module 300 in accordance with one embodiment. In various embodiments, the clock pulse generator module 300 may comprise, or be implemented as, the clock pulse generator module 104 of band switching system 100. The embodiments are not limited in this context.

In various embodiments, the clock pulse generator module 300 may comprise a node 302 to provide a positive signal (Up=true) to the input of a NAND gate 304 and to a low-pass filter (LPF) 306. The LPF 306 may comprise, for example, a resistor 308 and a capacitor 310 connected to ground 312. The output signal of the NAND gate 304 may be arranged to provide a negative active edge (Lo) only if both input signals are true. In various implementations, the signal at the top input of the NAND gate 304 may go true immediately when Up goes true. The signal at the bottom input of the NAND gate 304, however, may go true after a delay proportional to the time constant ($\tau$) of the LPF 306.

In various embodiments, the time constant of the LPF 306 may be set based on a lock time of a PLL, such as PLL filter 220. For example, the PLL may have a certain lock time if commanded to switch from one frequency to another. In one implementation, the delay proportional to the time constant of the LPF 306 may be set to greater than or equal to half of the lock time ($\tau$>=lock time/2). In some embodiments, a shorter time delay may be set.

In various implementations, the time constant of the LPF 306 may be arranged to deglitch an input signal. When changing frequencies, for example, there may be overshoot or undershoot due the specifics of the loop dynamics which could make an input signal instantaneously go above the Hi switching point or below the Lo switching point. The time constant of the LPF 306 may delay a band switching decision to avoid glitching or undershoot/overshoot, which could trigger a band switch. The time constant of the LPF 306 also may compensate for the momentary delay of a loop voltage at a reference voltage after changing bands.

In various embodiments, the clock pulse generator module 300 may comprise a node 314 to provide the output signal of the NAND gate 304 to a number of inverters 316-1 to 316-$n$, where n may comprise any integer value. In one embodiment, n may comprise an odd number such as 5, for example. The inverters 316-1 to 316-$n$ may be connected to a switch 318 that shorts the LPF 306 to ground 320 to create a pulse. In various implementations, each instance of UP going true may generate a pulse (Up Clk) at the output of the NAND gate 304. The pulse width (PW) may be proportional to the number of inverters (e.g., n=5). In one embodiment, the delay provided by the inverters 316-1 to 316-$n$ may be determined by the minimum clock pulse width of a counter.

In various embodiments, a node 322 may provide a positive signal (Down=true) to the input of a NAND gate 324 and to a LPF 326 comprising a resistor 328 and a capacitor 330 connected to ground 332. A node 334 may provide the output signal of the NAND gate 304 to a number of inverters 336-1 to 336-$n$ connected to a switch 338 that shorts the LPF 326 to ground 340. In various implementations, each instance of Down going true may generate a pulse (Down Clk) at the output of the NAND gate 324.

Figure 4:
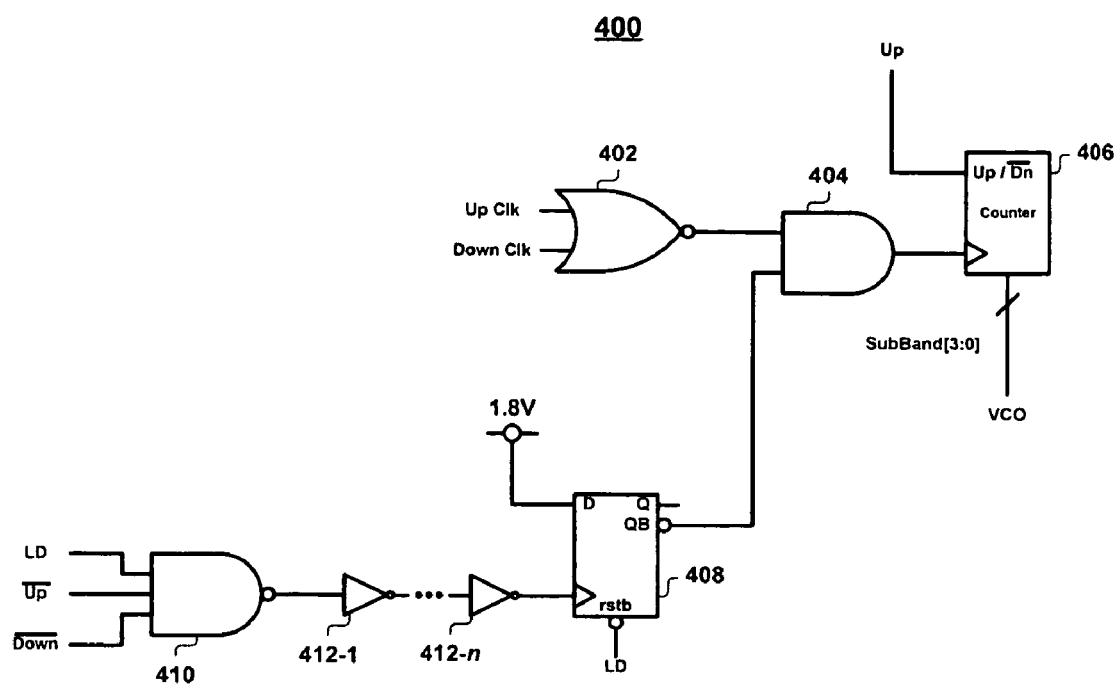
FIG. 4 illustrates a block diagram of a counter and gating module in accordance with one embodiment.

FIG. 4 illustrates a block diagram of a counter and gating module 400 in accordance with one embodiment. In various embodiments, the counter and gating module 400 may comprise, or be implemented as, the counter and gating module 106 of band switching system 100, for example. The embodiments are not limited in this context.

In various embodiments, the counter and gating module 400 may comprise a NOR gate 402 to receive pulses (Up Clk and Down Clk) from a clock pulse generator, such as clock pulse generator module 300. The NOR gate 402 may combine the pulses and provide an output signal to the top input an AND gate 404. If both inputs of the AND gate 404 are true, an output signal (e.g., clock pulse) may be passed to a counter 406. The counter 406 may comprise an Up/Down synchronous counter, for example. The counting direction of the counter 406 may be determined by the positive signal UP. In various implementations, the positive signal UP may become true instantaneously upon the loop filter voltage becoming greater than the Hi switching point and may precede the arrival of the output signal at the counter 406 by a LPF delay.

In various embodiments, the counter 406 may be arranged to output a VCO band select word (SubBand) to a VCO, such as VCO 222, for example. The VCO select word may comprise a digital signal such as 4 bit word (e.g., 1111 highest frequency). In various implementations, the VCO select word may control the selection of an individual tuning band (e.g., Band0, Band1, and Band2).

In various implementations, the AND gate 404 in conjunction with a register 408, for example, may comprise a state machine defining when band switching is allowed and disallowed. In one embodiment, for example, the bottom input of the AND gate 404 may be connected to a register 408. The register 408 may be arranged to allow band switching to occur when a Lock Detect (LD) signal is false. For example, the register 408 may be reset or held in reset when the LD signal is false to allow band switching. When the LD signal becomes true, the register 408 comes out of reset in a known state (e.g., Q=false). In various embodiments, the LD signal may be true (e.g., 1=Locked) when a lock condition is within a predetermined metric related to phase error and may be false when a lock condition is outside of the predetermined metric. In various implementations, the AND gate 404 may permit the counter 406 to drive VCO band selection when the LD signal is false.

The counter and gating module 400 may comprise a NAND gate 410. In various embodiments, the NAND gate 410 may be arranged to generate a clock edge when the LD signal becomes true and both the Up signal and Down signal are false. The clock edge may be delayed by an inverter chain comprising multiple inverters 412-1 to 412-$n$, for example. In various implementations, the inverter chain delay may be greater than the time needed for the register 408 to recover from reset.

In various implementations, when the clock edge arrives at the clock input of the register 408, Q may be set to true (Q=true) to disable band switching. The output (QB) of the register 408 provided to the AND gate 404 may be false and continue to be held false until the LD signal is no longer true.

In various embodiments, band switching may be disabled when lock is detected, provided that the loop filter voltage is between the Hi switching point and the Lo switching point. In some implementations, if the LD signal is true and the loop filter voltage previously was between the Hi switching point and the Lo switching point, band switching may be disabled until the LD signal is no longer true. For example, band switching may be disabled during a call even if the loop filter voltage momentarily goes above the Hi switching point or below the Lo switching point.

In various embodiments, the Hi switching point and the Lo switching point may be chosen to guarantee that the VCO can tune a locked frequency over the entire temperature range to accommodate temperature changes after a lock has occurred. For example, the Lo switching point and the Hi switching point may be set a sufficient amount from the edges of tuning so that tuning can still occur even if the temperature drifts during a call.

Operations for various embodiments may be further described with reference to the following figures and accompanying examples. Some of the figures may include a process and/or logic flow. It can be appreciated that an illustrated process and/or logic flow merely provides one example of how the described functionality may be implemented. Further, a given process and/or logic flow does not necessarily have to be executed in the order presented unless otherwise indicated. In addition, a process and/or logic flow may be implemented by a hardware element, a software element executed by a processor, or any combination thereof. The embodiments are not limited in this context.

Figure 5:
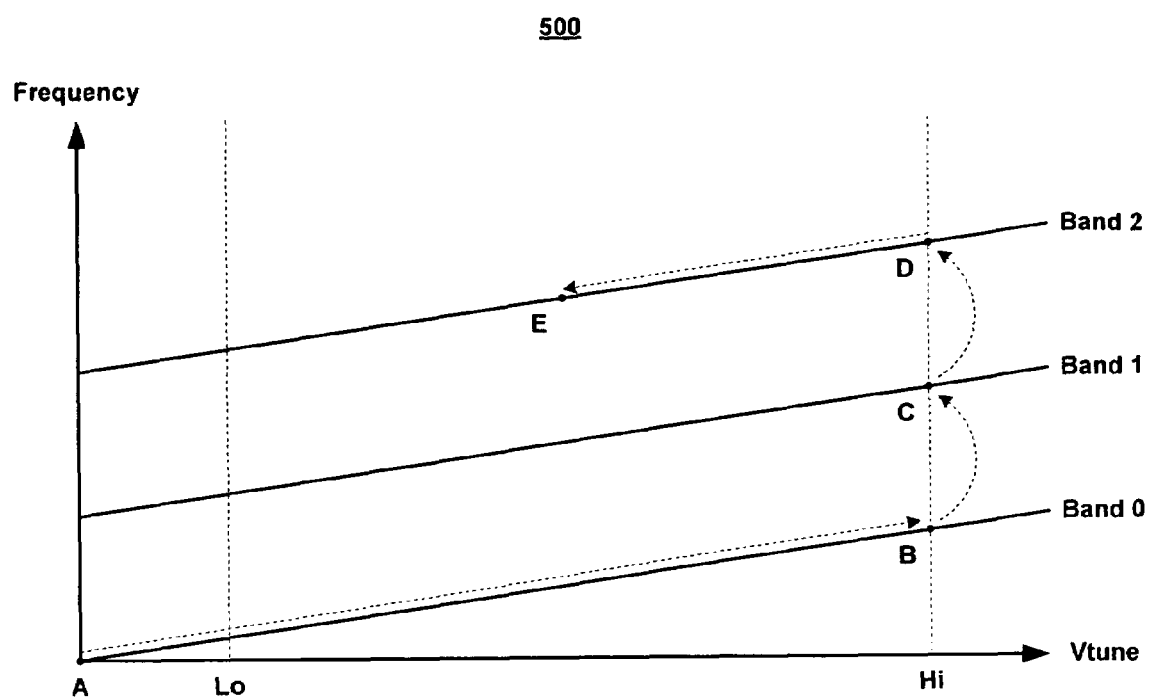
FIG. 5 illustrates a graphical representation of a band search process in accordance with one embodiment.

FIG. 5 illustrates a graphical representation of a band search process 500 in accordance with one embodiment. In various embodiments, the band search process 500 may be performed by the band switching system 100, for example. The embodiments are not limited in this context.

In one embodiment, for example, an initial condition may be represented by point A on Band 0, and an ultimate point of phase locking may be represented by point E on Band 2. Upon power-up, the loop filter voltage may be at point A on Band 0. A band change decision may be delayed by a LPF time constant. The time constant may be set large enough for the loop filter voltage to rise above a Lo switching point before switching commences. The LPF delay may be set, for example, to be greater than or equal to half of the lock time (e.g., τ=lock time/2).

After the loop filter voltage reaches point B on Band 0, the counter may increment one count to place the VCO at point C on Band 1. As the frequency needs to be higher to reach the ultimate point of phase locking, the loop filter voltage may remain at or above the Hi switching point while the VCO is on Band 1. One delay after reaching point C, the counter may increment to place the VCO at point D on Band 2. As the ultimate point of lock lies at point E, one delay later may find the loop filter voltage on Band 2 between point D and point E. Once the loop filter voltage reaches the voltage corresponding to point E, a LD signal will become true, and the VCO calibration loop will be disabled.

FIG. 6 illustrates a logic flow 600 for performing band switching in accordance with one embodiment. The logic flow 600 may be performed by a band switching system, such as band switching system 100, for example. It is to be understood that the logic flow 600 may be implemented by various other types of hardware, software, and/or combination thereof. The embodiments are not limited in this context.

In various embodiments, the logic flow 600 may comprise establishing a Hi switching point associated with a maximum acceptable tuning voltage and a Lo switching point associated with a minimum acceptable tuning voltage at block 602. At block 604, a loop filter voltage may be compared to the Hi switching point and the Lo switching point. In the event that the loop filter voltage is instantaneously greater than the Hi switching point or instantaneously less than the Lo switching point a positive signal (UP=true, Down=true) may be generated at block 606.

In response to a positive signal (e.g., Up=true, Down=true), a clock pulse may be generated at block 608. In various implementations, the clock pulse may comprise a first time constant to provide a delay before action occurs. The first time constant may be associated with a low pass filter (LPF) and provide a setup time proportional to the LPF time constant, for example. In various implementations, the clock pulse may comprise a second time constant equal to a delay through a chain of inverters. The second time constant may provide a hold time for a pulse equal to the inverter chain delay, for example.

At block 610, a lock condition may be detected. If a lock condition is not detected, a counter may be incremented based on the clock pulse to drive VCO band switching at block 612. If a lock condition is detected, band switching may be disabled at block 614. In various implementations, band switching may be disabled when a lock condition is detected and the loop filter voltage is between the Hi switching point and the Lo switching point. Band switching also may be disabled when a lock condition is detected and the loop filter voltage previously was between the Hi switching point and the Lo switching point. Band switching may be disabled if the loop filter voltage momentarily goes above the Hi switching point or below the Lo switching point. Once disabled, band switching may remain disabled until the lock condition is not longer detected.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

In various implementations, the described embodiments may comprise, or form part of a wired communication system, a wireless communication system, or a combination of both. Although certain embodiments may be illustrated using a particular communications media by way of example, it may be appreciated that the principles and techniques discussed herein may be implemented using various communication media and accompanying technology.

In various implementations, the described embodiments may comprise or form part of a network, such as a Wide Area Network (WAN), a Local Area Network (LAN), a Metropolitan Area Network (MAN), the Internet, the World Wide Web, a telephone network, a radio network, a television network, a cable network, a satellite network, a wireless personal area network (WPAN), a wireless WAN (WWAN), a wireless LAN (WLAN), a wireless MAN (WMAN), a Code Division Multiple Access (CDMA) cellular radiotelephone communication network, a third generation (3G) network such as Wide-band CDMA (WCDMA), a fourth generation (4G) network, a Time Division Multiple Access (TDMA) network, an Extended-TDMA (E-TDMA) cellular radiotelephone network, a Global System for Mobile Communications (GSM) cellular radiotelephone network, a North American Digital Cellular (NADC) cellular radiotelephone network, a universal mobile telephone system (UMTS) network, and/or any other wired or wireless communications network configured to carry data.

In various implementations, the described embodiments may be arranged to communicate information over one or more types of wireless communication media. In such implementations, the described embodiments may include a wireless node having components and interfaces suitable for communicating information signals over the designated wireless spectrum, such as one or more antennas, wireless transmitters, wireless, wireless transceivers, amplifiers, filters, control logic, and so forth.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The instructions may include any suitable type of code, such as source code, compiled code, interpreted code, executable code, static code, dynamic code, and the like. The instructions may be implemented using any suitable high-level, low-level, object-oriented, visual, compiled and/or interpreted programming language.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. A band switching apparatus, comprising:
a reference generation and comparison module to generate a positive signal based on a comparison of a loop filter voltage associated with a voltage controlled oscillator to a maximum tuning voltage and a minimum tuning voltage;
a clock pulse generation module to generate a clock pulse in response to said positive signal; and
a counter and gating module to disable band switching of said voltage controlled oscillator when a lock condition is detected and said loop filter voltage comprises a voltage between said maximum tuning voltage and said minimum tuning voltage.

2. The band switching of claim 1, wherein said reference generation module comprises a phase-locked loop filter to provide said loop filter voltage based on an output voltage waveform of said voltage controlled oscillator.

3. The band switching apparatus of claim 1, wherein said reference generation module comprises a first comparator to compare said loop filter voltage to a first reference voltage and a second comparator to compare said loop filter voltage to a second reference voltage.

4. The band switching apparatus of claim 1, wherein said clock pulse generation module comprises a low-pass filter and said clock pulse comprises a time constant associated with said low-pass filter.

5. The band switching apparatus of claim 4, wherein said clock pulse generation module comprises a logic gate to generate said clock pulse based on a first input comprising said positive signal and a second input comprising said positive signal delayed by said time constant.

6. The band switching apparatus of claim 4, wherein said clock pulse generation module comprises a switch to short said low-pass filter to ground.

7. The band switching apparatus of claim 1, wherein said clock pulse generation module comprises an inverter chain and said clock pulse comprises a time constant equal to a delay through said inverter chain.

8. The band switching apparatus of claim 7, wherein said clock pulse comprises a pulse width proportional to said inverter chain.

9. The band switching apparatus of claim 1, wherein said counter and gating module comprises a counter to output a band select word to said voltage controlled oscillator.

10. The band switching apparatus of claim 9, wherein said counter outputs said band select word if a lock condition is not detected.

11. The band switching apparatus of claim 9, wherein said band select word controls band switching of said voltage controlled oscillator.

12. The band switching apparatus of claim 1, wherein said counter and gating module comprises a register to disable band switching in response to a clock edge provided by a logic gate.

13. The band switching apparatus of claim 12, wherein said clock edge is delayed by an inverter chain.

14. A band switching method, comprising:
generating a positive signal based on a comparison of a loop filter voltage associated with a voltage controlled oscillator to a maximum tuning voltage and a minimum tuning voltage;
generating a clock pulse in response to said positive signal; and
disabling band switching of said voltage controlled oscillator when a lock condition is detected and said loop filter voltage comprises a voltage between said maximum tuning voltage and said minimum tuning voltage.

15. The band switching method of claim 14, further comprising providing said loop filter voltage based on an output voltage waveform of said voltage controlled oscillator.

16. The band switching method of claim 14, further comprising comparing said loop filter voltage to a first reference voltage and comparing said loop filter voltage to a second reference voltage.

17. The band switching method of claim 14, wherein generating said clock pulse comprises delaying said positive signal by a time constant associated with a low-pass filter.

18. The band switching method of claim 14, wherein said clock pulse comprises a time constant equal to a delay through an inverter chain.

19. The band switching method of claim 14, further comprising outputting a band select word to said voltage controlled oscillator if a lock condition is not detected.

20. The band switching method of claim 19, further comprising controlling band switching of said voltage controlled oscillator based on said band select word.

21. The band switching method of claim 14, wherein disabling band switching comprises generating a clock edge in response to a detected lock condition.

22. The band switching method of claim 20, further comprising delaying said clock edge by an inverter chain.

23. A system, comprising:
an antenna; and
an integrated circuit coupled to said antenna, said integrated circuit comprising a band switching apparatus, said band switching apparatus comprising: a reference generation and comparison module to generate a positive signal based on a comparison of a loop filter voltage associated with a voltage controlled oscillator to a maximum tuning voltage and a minimum tuning voltage;
a clock pulse generation module to generate a clock pulse in response to said positive signal; and
a counter and gating module to disable band switching of said voltage controlled oscillator when a lock condition is detected and said loop filter voltage comprises a voltage between said maximum tuning voltage and said minimum tuning voltage.

24. The system of claim 23, wherein said integrated circuit comprises a complementary metal oxide semiconductor voltage controlled oscillator.

25. The system of claim 23, wherein said integrated circuit comprises a phase-locked loop filter to provide said loop filter voltage based on an output voltage waveform of said voltage controlled oscillator.

* * * * *